United States Patent [19]
Ivanov et al.

[11] Patent Number: 5,917,376
[45] Date of Patent: Jun. 29, 1999

[54] CIRCUIT AND TECHNIQUE FOR COMPENSATING HIGH GAIN AMPLIFIER WITHOUT COMPENSATION CAPACITORS

[75] Inventors: Vadim V. Ivanov, Tucson, Ariz.; Valery N. Ivanov, St. Petersburg, Russian Federation

[73] Assignee: Burr-Brown Corporation, Tucson, Ariz.

[21] Appl. No.: 08/916,869

[22] Filed: Aug. 22, 1997

[51] Int. Cl.$^6$ .................. H03F 1/00; H03F 3/04; H03F 3/45
[52] U.S. Cl. .................. 330/151; 330/310; 330/260
[58] Field of Search .................. 330/151, 150, 330/107, 109, 292, 310, 294, 311, 260

[56] References Cited

U.S. PATENT DOCUMENTS

| | | | |
|---|---|---|---|
| 4,243,943 | 1/1981 | Cherry | 330/100 |
| 4,502,017 | 2/1985 | Van de Plassche et al. | 330/151 |
| 4,559,502 | 12/1985 | Huijsing | 330/294 |
| 4,659,998 | 4/1987 | Rokos | 330/260 |
| 4,999,585 | 3/1991 | Burt et al. | 332/149 |
| 5,148,119 | 9/1992 | Wright et al. | 330/259 |
| 5,155,447 | 10/1992 | Huijsing et al. | 330/107 |
| 5,218,320 | 6/1993 | Albouy et al. | 330/259 |
| 5,258,723 | 11/1993 | Mazzucco et al. | 330/258 |
| 5,365,199 | 11/1994 | Brooks | 330/291 |
| 5,410,273 | 4/1995 | Brehmer et al. | 330/253 |
| 5,477,190 | 12/1995 | Brehmer et al. | 330/253 |
| 5,485,121 | 1/1996 | Huijsing et al. | 330/260 |
| 5,486,790 | 1/1996 | Huijsing et al. | 330/260 |
| 5,568,090 | 10/1996 | Pierret | 330/255 |
| 5,635,871 | 6/1997 | Cavigelli | 330/107 |

*Primary Examiner*—Robert Pascal
*Assistant Examiner*—Patricia Nguyen
*Attorney, Agent, or Firm*—Cahill, Sutton & Thomas P.L.C.

[57] ABSTRACT

A three-stage amplifier including first, second, and third sequentially coupled stages is compensated without use of compensation capacitors, by applying an input signal to an input of the first stage and a first input of a first feed-forward stage, coupling an output signal of the first feed-forward stage to an output of the second stage, the second stage having an input coupled to an output of the first stage, coupling an output signal of the first stage to an input of a second feed-forward stage, coupling an output of the second feed-forward stage to an output of the third stage, coupling the input signal to an input of a third feed-forward stage, and coupling an output of the third feed-forward stage to the output of the third stage.

17 Claims, 7 Drawing Sheets

CIRCUIT AND TECHNIQUE FOR COMPENSATING HIGH GAIN AMPLIFIER WITHOUT COMPENSATION CAPACITORS

BACKGROUND OF THE INVENTION

The invention relates to circuitry and techniques for providing a stable, high gain amplifier by feed-forward compensation of one or more gain stages thereof without use of compensation capacitors, to thereby reduce power consumption and physical size of the amplifier circuit; the invention also relates to an alternative technique to that shown in U.S. Pat. No. 5,155,447 for combining the use of feed-forward stages and compensation capacitors to stabilize an amplifier.

The state of the art is believed to be generally indicated by U.S. Pat. No. 5,155,447 (Huijsing et al), U.S. Pat. No. 5,485,121 (Huijsing et al), and U.S. Pat. No. 4,559,502 (Huijsing). The basic teaching of the Huijsing et al '447 patent entails first creating a stable two-stage amplifier by capacitively nesting a pair of amplifier stages in cascade, and then creating a stable three-stage amplifier by capacitively nesting the two-stage amplifier and an additional first amplifier stage with a feed-forward path being provided from the additional first stage around the second stage to the third stage to provide the high-frequency response of a two-stage amplifier and the low-frequency gain of a three-stage amplifier. FIG. 7 of the Huijsing et al '447 patent is reproduced herein as prior art FIG. 1. That circuit and other circuits known in the prior art feed signals forward to increase low frequency gain in multi-stage high gain amplifiers, but they also include compensation capacitors to accomplish frequency compensation which stabilizes the high gain amplifier by reducing the frequency response rolloff slope to −20 dB per decade at the unity gain point. For example, in prior art FIG. 1 hereof, feedback compensation capacitors C1 and C2 are utilized to stabilize the three-stage amplifier. (Those skilled in the art know that it often is necessary to provide multiple gain stages to obtain the desired accuracy in many amplifier applications because the high frequency gain obtainable with a single-stage or two-stage amplifier is far too low for many applications. Those skilled in the art also know that the use of multiple gain stages substantially complicates the problems of achieving frequency stability.)

It is desirable to avoid use of compensation capacitors to accomplish frequency compensation of amplifier circuitry because compensation capacitors add delays that result in reduction of gain of the amplifier circuitry. This necessitates increasing the bias currents needed for the gain stages of the amplifier circuitry in order to maintain its desired gain and bandwidth and hence its accuracy. Such increased bias currents result in undesirably increased power dissipation. Furthermore, integrated circuit compensation capacitors require a large amount of semiconductor chip area and therefore increase the physical size and hence the cost of the chip.

Accordingly, it would be highly desirable to provide a stable amplifier circuit of three or more stages, which has very high gain, is stable, and avoids or at least minimizes use of compensation capacitors to accomplish frequency stabilization.

SUMMARY OF THE INVENTION

Accordingly, it is an object of the invention to provide a circuit and technique for stabilizing three or more sequentially connected amplifier gain stages without using compensation capacitors.

It is another object of the invention to provide a circuit and technique for providing a high gain, frequency-stable amplifier of three or more stages in which it is not necessary to increase the total gain stage bias current to offset gain loss due to use of compensation capacitors.

It is another object of the invention to achieve frequency compensation of three or more sequentially coupled gain stages without compensation capacitors to avoid delays caused thereby and achieve faster circuit operation for a predetermined amount of bias current.

Briefly described, and in accordance with one embodiment thereof, the invention provides amplifier circuitry (1A) that is frequency-compensated without the use of a compensation capacitor, the amplifier circuitry having an input (11) receiving an input signal (vin), and an output (9) producing an output signal (vout), the amplifier circuitry (1A) including a first amplifier stage (30) having a first input (−) coupled to the input (11) of the amplifier circuitry, a second input (−), and an output, a second amplifier stage (15) having an input (−) coupled to the output of the first amplifier (1A) and an output (10), a third amplifier stage (17) having an input coupled to the output (10) of the second amplifier stage and an output coupled to the output (9) of the amplifier circuitry, a first feed-forward amplifier stage (31) including a first input (−) coupled to the input (11) of the amplifier circuitry, and also including a second input (+), the first feed-forward amplifier stage (31) including an output coupled to the output (10) of the second amplifier stage (15), or a second feed-forward stage (33) having a first input (−) coupled to the output of the first amplifier stage (30), a second input (+), and an output coupled to the output (9) of the amplifier circuitry (1A), and a third feed-forward amplifier stage (32) having a first input (−) coupled to the input (11) of the amplifier circuitry (1A), a second input (+), and an output coupled to the output (9) of the amplifier circuitry. Feedback circuitry (12) is coupled between the output (9) of the amplifier circuitry (1A) and the second inputs (+) of the first amplifier stage (30), the first feed-forward amplifier stage (31), and the third feed-forward amplifier stage (32). The gains of the first and second amplifier stages are such that the bandwidth of the combined first and second amplifier stages is at least approximately three times less than the bandwidth of the first feed-forward amplifier stage. The gains of the second and third amplifier stages are such that the bandwidth of the combined second and third amplifier stages is at least approximately three times less than the bandwidth of the second feed-forward amplifier stage. The gains of the first, second, and third amplifier stages are such that the bandwidth of the combined first, second, and third amplifier stages is at least approximately three times less than the bandwidth of the third feed-forward amplifier stage.

In another embodiment of the invention, a four-stage amplifier including sequentially coupled first, second, third, and fourth stages is compensated by coupling a first capacitor between an output of the fourth stage and an input of the second stage to provide negative unity feedback at high frequencies and to establish the bandwidth of the four-stage amplifier, the input of the second stage being coupled to an output of the first stage, an output of the second stage being coupled to an input of the third stage, and an output of the third stage being coupled to an input of the fourth stage, applying an output signal of the first stage to an input of a feed-forward stage and the input of the second stage, applying an output signal of the feed-forward stage to the output of the third stage to compensate a first equivalent amplifier comprised of the second and third stages, and coupling a second capacitor between the input of the second stage and the output of the third stage to compensate a second equivalent amplifier comprised of the first equivalent amplifier and the fourth stage.

DETAILED DESCRIPTION OF THE PREFERRED EMBODIMENT

Figure 2A:
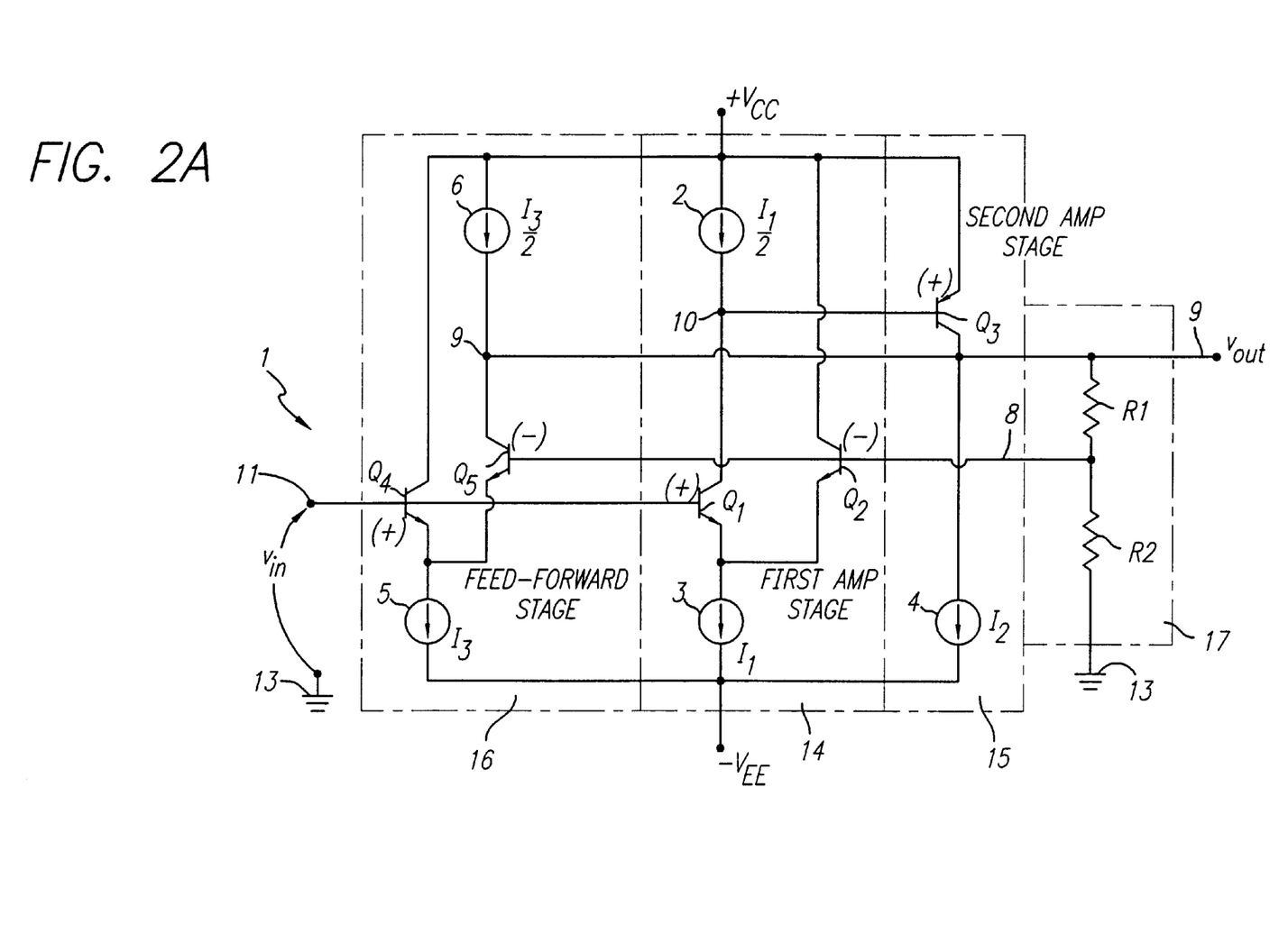
FIG. 2A is a schematic diagram illustrating feed-forward compensation of a two-stage amplifier.

Referring to FIG. 2A, high frequency, high gain amplifier 1 includes a "first amplifier" stage 14 including emitter-coupled NPN transistors Q1 and Q2, the emitters of which are connected to current source 3 producing a constant current I1, which may be approximately 0.1 microamperes. Current source 3 is connected to $-V_{EE}$. The base of transistor Q1 is connected to input conductor 11. An input signal $V_{in}$ is applied between a ground conductor 13 and input conductor 11. The base of transistor Q2 is connected by a feedback conductor 8 to a junction between resistors R1 and R2. Resistors R1 and R2 are connected in series between an output conductor 9 of amplifier 1 and the ground conductor 13. An output voltage $V_{out}$ is produced by amplifier 1 on output conductor 9, and resistors R1 and R2 form a negative feedback stage to first amplifier stage Q1,Q2.

The collector of transistor Q1 is connected by conductor 10 to a constant current source 2 which functions as a load element, the other terminal of which is connected to $+V_{cc}$. Current source 2 provides a constant current I1/2 to the collector of transistor Q1. Conductor 10 also is connected to the base of PNP transistor Q3. The emitter of transistor Q3 is connected to $+V_{cc}$, and its collector is connected by output conductor 9 to current source 4, the other terminal of which is connected to $-V_{EE}$. Current source 4 provides a constant current I2, which may be approximately 2 or 3 microamperes. Transistor Q3 and current source 4 form a "second amplifier stage" 15.

Frequency stabilization for the first and second amplifier stages 14 and 15 is accomplished by providing a feed-forward stage 16 including NPN transistors Q4 and Q5 and constant current sources 5 and 6, without using any feedback capacitors (such as capacitors C1 and C2 in prior art FIG. 1) to accomplish frequency stabilization for those two stages 14 and 15. Current source 5 provides constant current of I3, which may be approximately 5 microamperes to 5 milliamperes, and current source 6 supplies constant current of I3/2. The emitters of NPN transistors Q4 and Q5 are connected to one terminal of current source 5, the other terminal of which is connected to $-V_{EE}$. The base of transistor Q4 of the feed-forward stage 16 is connected to input conductor 11. The collector of transistor Q4 is connected to $+V_{cc}$. The base of transistor Q5 is connected to feedback conductor 8. The collector of transistor Q5 is connected by output conductor 9 to one terminal of current source 6, the other terminal of which is connected to $+V_{cc}$.

Figure 1:
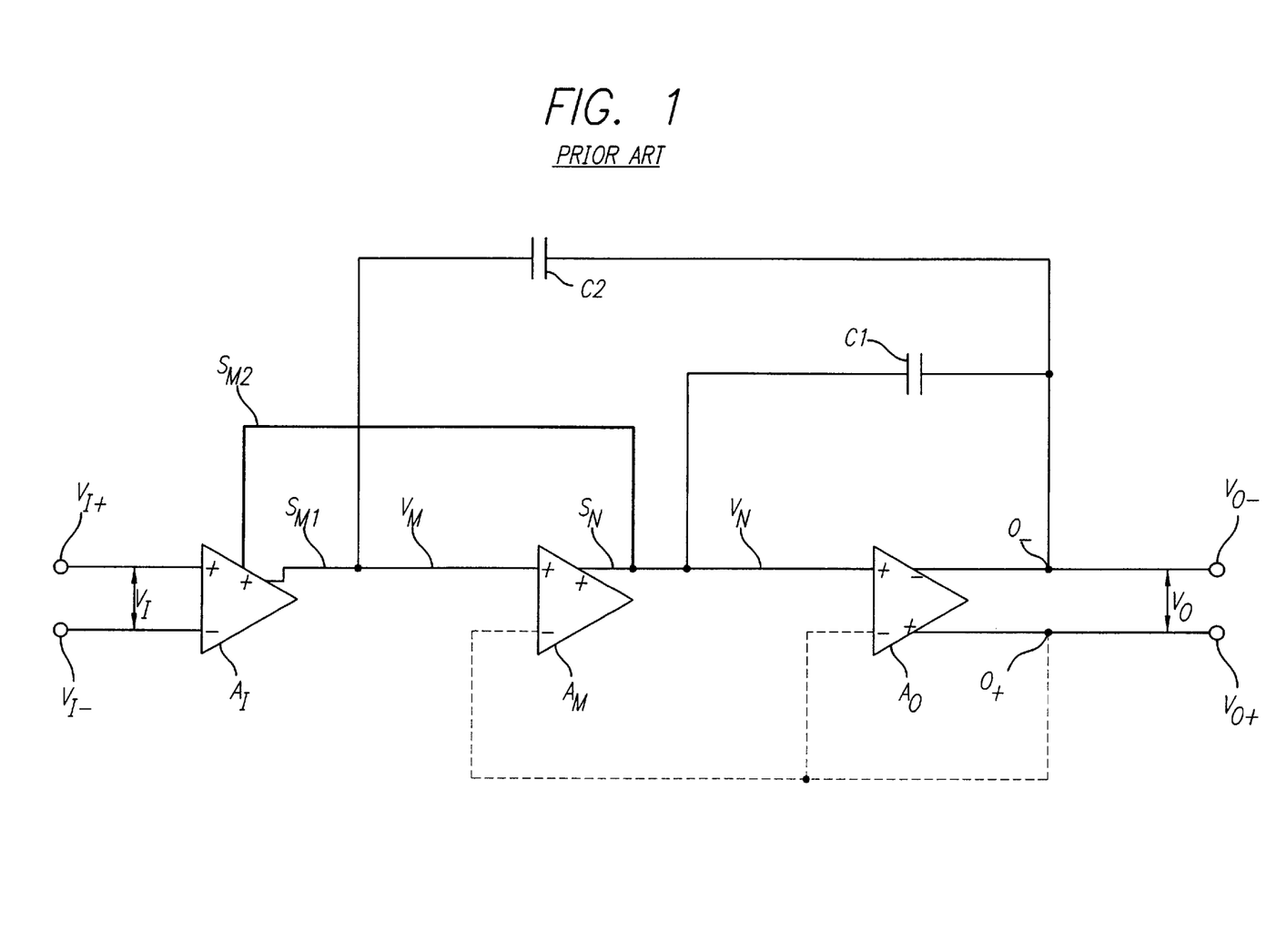
FIG. 1 is a schematic diagram illustrative of the prior art.

As in any amplifier, the open loop gain of the basic two-stage amplifier shown in FIG. 1 inherently "rolls off" as the operating frequency increases. With the feedback network 17 connected as shown, amplifier circuit 1 becomes unstable and oscillates if it has a natural frequency or time consonant at which the gain falls below unity. Suitable frequency compensation of stages 14 and 15 is provided by feed-forward stage 16 without use of any feedback compensation capacitors, necessary to prevent such oscillation/instability. Note that the above mentioned "first stage" 14 and the feed-forward stage 16 correspond to the amplifier $A_f$ in the above mentioned prior art shown in FIG. 1 hereof, and the second stage 15 of FIG. 2 corresponds to the amplifier $A_M$ in the prior art circuit shown in FIG. 1.

The transconductance and speed of each gain stage is directly proportional to the bias current of that stage, and the bias current ratios or gains of the feed-forward stages and the amplifier stages to be compensated are balanced to provide the desired amount of compensation. (If field effect transistors are used, the channel dimension ratios can be adjusted to obtain the desired relationship between gain and speed of each gain stage instead of adjusting the biasing currents for bipolar transistor gain stages.)

Therefore, the ratios of the currents I1 and I3 are adjusted to balance the gain of the feed-forward stage 16 and the combined gain of stages 14 and 15 so as to cause the bandwidth of the feed-forward stage 16 to be at least three or four times, and preferably ten times, the bandwidth of the combined amplifier stages 14 and 15.

Figure 2B:
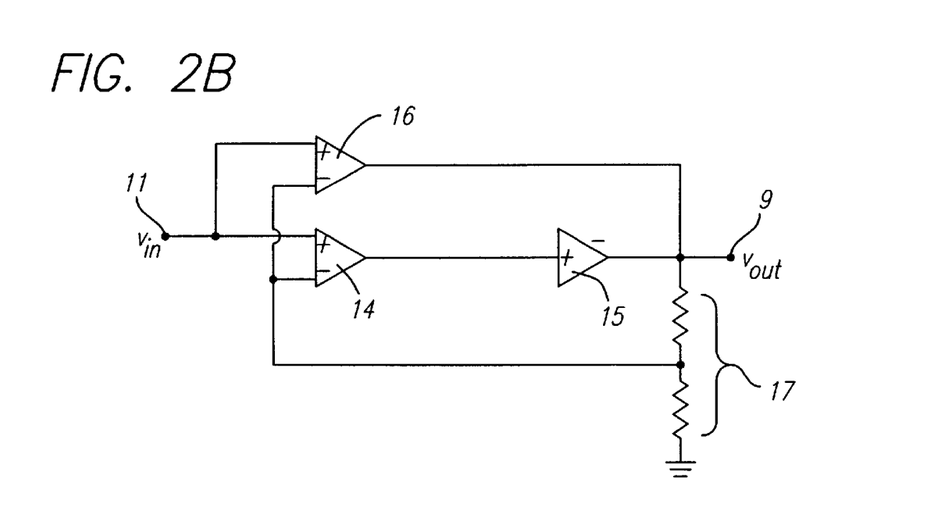
FIG. 2B is a block diagram of the circuit of FIG. 2A.
Figure 3:
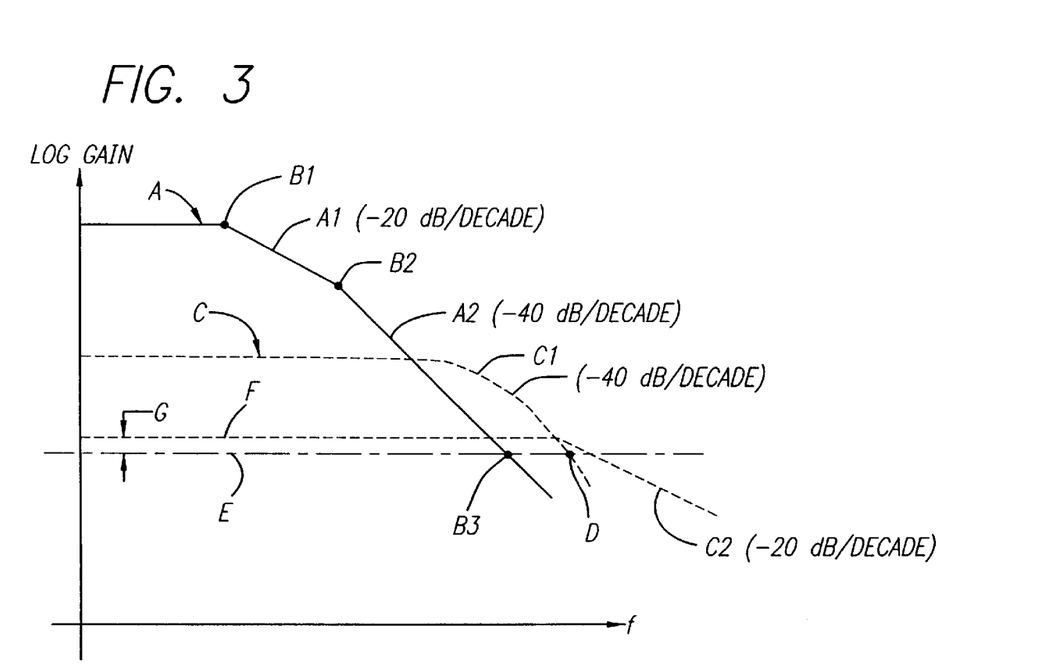
FIG. 3 is a Bode plot of the open loop and closed loop transfer characteristics of the two-stage amplifier of FIGS. 2A and 2B.

FIG. 3 shows a logarithmic transfer characteristic (Bode plot) of both the open loop gain and closed loop gain of the amplifier of FIGS. 2A and 2B. Curve A designates the open loop gain, with "break points" B1 and B2. Segment A1 between points B1 and B2 has a slope of –20 dB per decade. Segment A2 of the open loop characteristic for frequencies higher than that of point B2 has a slope of –40 dB per decade. Horizontal line E represents the unity gain point of the amplifier and point B3 represents the frequency at which the open loop gain has rolled off to the point at which the open loop gain is unity.

Dotted line C represents the closed loop transfer curve of the two-stage amplifier of FIGS. 2A and 2B. Portion C1 of closed loop transfer curve C shows its high frequency rolloff slope of –40 dB per decade. For a three-stage amplifier, both the open loop and the closed loop transfer curves would roll off to a slope of –60 dB per decade, and so on.

Generally, a feedback system will be stable if its transfer curve plotted on a logarithmic scale has a slope less negative than –40 dB per decade at the unity gain and/or if the negative feedback phase delay is less than 180 degrees. The gain and bandwidth of the feed-forward stage 16 in FIGS. 2A and 2B must be high enough to ensure that the slope of the composite curve is less negative than –40 dB per decade at the unity gain point. Thus, in the circuits of 2A and 2B, the gain of feed-forward amplifier 16 and the frequency of its roll off break point must be high enough to change the slope of its transfer curve just above unity gain line E from a slope of, for example, –60 dB per decade, to a slope less negative than –40 dB per decade.

For a two-stage amplifier, providing a single feed-forward amplifier having an input connected to the input of the multi-stage amplifier and an output connected to an output of the two-stage amplifier can change the slope of the closed loop transfer characteristic at or just above the unity gain point from −40 dB per decade to −20 dB per decade, as shown in the prior art circuit of FIG. 1. However, extending this technique to an amplifier of three or more stages without use of any compensation capacitors (which are required in prior art FIG. 1) is substantially more complex.

For a three or four stage amplifier, if it is not known in advance what the feedback will be, then it is necessary to provide compensation which corrects the slope of the open loop transfer characteristic to less negative than −40 dB per decade or prevents a negative feedback phase delay of 180 degrees.

The basic feed-forward technique without compensation capacitors as described above can be extended to amplifiers including three or more stages. Theoretically, an N-stage amplifier can be frequency compensated entirely without use of capacitors by using N! (N factorial) feed-forward stages, although this may require far too many transistors to be practical. If it is impractical, "subgroups" of three or more sequentially connected amplifier stages can be compensated by use of feed-forward amplifiers, and other portions of the multi-stage amplifier can be compensated using frequency compensation capacitors.

Figure 4A:
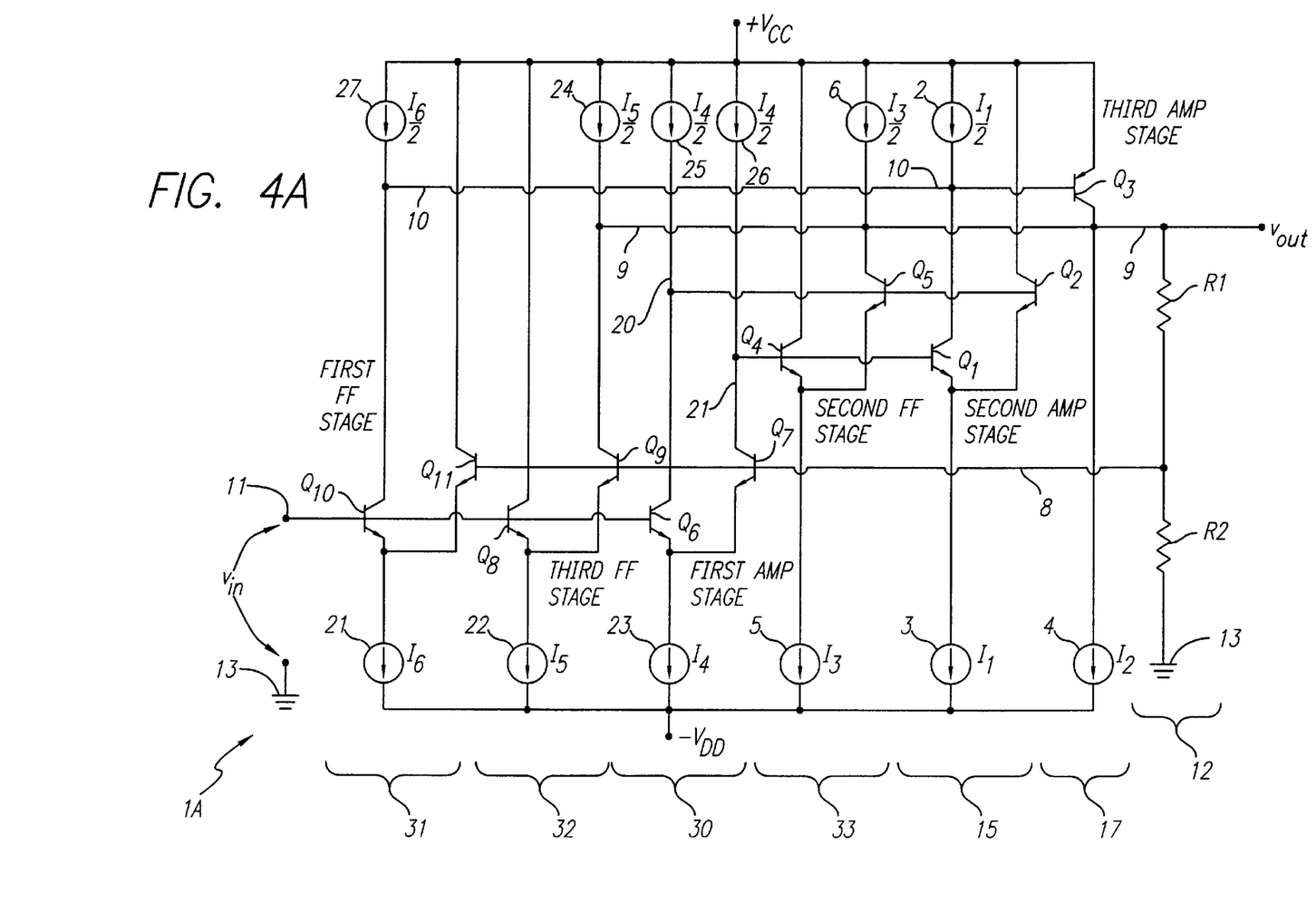
FIG. 4A is a schematic diagram of one embodiment of the invention including two feed-forward stages used to accomplish frequency stabilization of a three-stage amplifier without use of compensation capacitors.
Figure 4B:
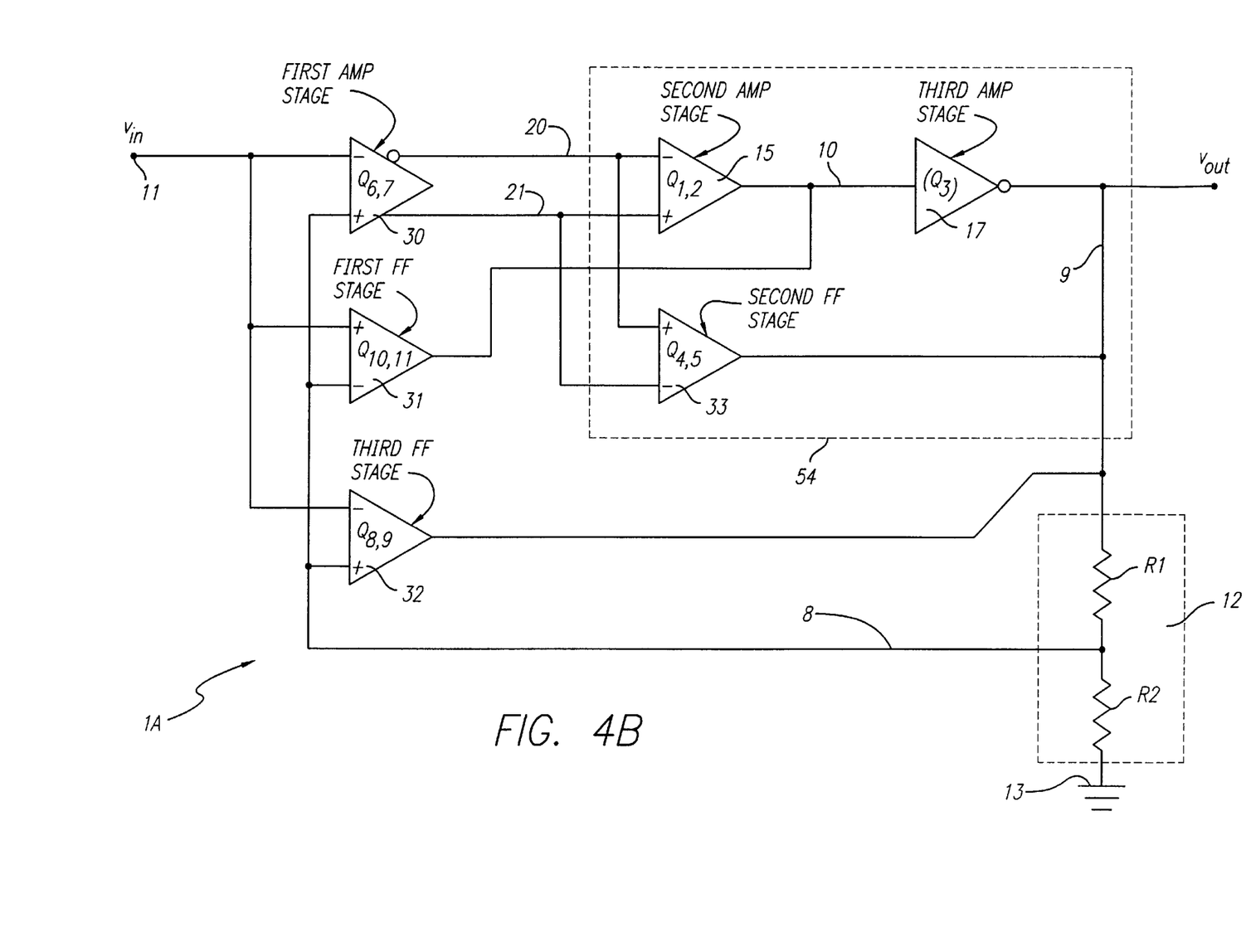
FIG. 4B is a block diagram of the circuit shown in FIG. 4A.

Referring to FIGS. 4A and 4B, a three-stage amplifier 1A includes a "first amplifier stage" 30 formed by NPN transistors Q6 and Q7, a "second amplifier stage" 15 formed by NPN transistors Q1 and Q2, and a "third amplifier stage" 17 formed by PNP transistor Q3 current source 4. (FIG. 4B shows a block diagram of the circuit of FIG. 4A and is helpful in understanding it.) The three stages 30, 15 and 17 are sequentially connected, with stage 30 as an input stage, stage 15 as an intermediate stage, and stage 17 as an output stage. A "first feed-forward stage" 31 is formed by NPN transistors Q10 and Q11 to produce an output connected by conductor 10 to the input of the third amplifier stage 17. The input conductor 11 is connected to the non-inverting input of a first feed-forward amplifier stage 31 and the inverting input of a third feed-forward amplifier stage 32 formed by transistors Q8 and Q9. A second "feed-forward amplifier stage" 33 is formed by transistors Q4 and Q5, just as in FIG. 2A. An inverted output of amplifer stage 30 is connected by conductor 20 to the inverting input of stage 15 and the non-inverting input of feed-forward stage 33. The non-inverted output of stage 30 is connected by conductor 21 to the non-inverting input of stage 15 and the inverting input of feed-forward stage 33. Conductor 8 of feedback circuit 12 is connected to the non-inverting inputs of stages 30 and 32 and to the inverting input of stage 31. An output of the second feed-forward stage 33 is connected to $V_{OUT}$ conductor 9.

An approach to compensating the basic three-stage amplifier of FIGS. 4A and 4B including stages 30, 15 and 17 is as follows. First, the gain, and hence the bandwidth, of first feed-forward stage 31 is balanced with the combined gains of first and second stage amplifiers 30 and 15 so that the bandwidth of feed-forward stage 31 is approximately ten times greater than the combined bandwidth of stages 30 and 15. This is accomplished by reducing the bias currents of one or both of stages 30 and 15 to proportionately reduce their combined gain compared to that of feed-forward stage 31. Then the combined gains of stages 15 and 17 are reduced so that the gain of second feed-forward stage 33 is approximately ten times that of the combined gain of stages 15 and 17. At that point, the amplifier of FIG. 4B can be thought of as an uncompensated two-stage amplifier including input stage 30 and an "equivalent" stage 54 encircled by dotted lines and including the two compensated stages 15 and 17.

That equivalent amplifier 54 still could be unstable. Therefore, its combined gain, and hence its bandwidth, is adjusted to be approximately ten times less than that of third feed-forward stage 32, which normally would have the highest bandwidth of any of the stages shown in FIG. 4B. (Although the bandwidths of the feed-forward stages described herein preferably are about ten times greater than the bandwidths of the combined stages compensated thereby, this ratio could be as low as three.)

The above general approach is in contrast to that of the prior art, wherein capacitors are used to decrease the bandwidth of the internal circuit loop and the overall amplifier, and feed-forward is used to provide additional low frequency gain.

Alternatively, either of feed-forward stages 31 or 33 could be omitted if, for the particular feedback being used, the negative feedback phase delay does not equal 180 degrees.

The ratios of the bias currents of each of the above three amplifier stages and their associated feed-forward stages are adjusted to provide the necessary frequency compensation at the various circuit nodes.

Figure 5A:
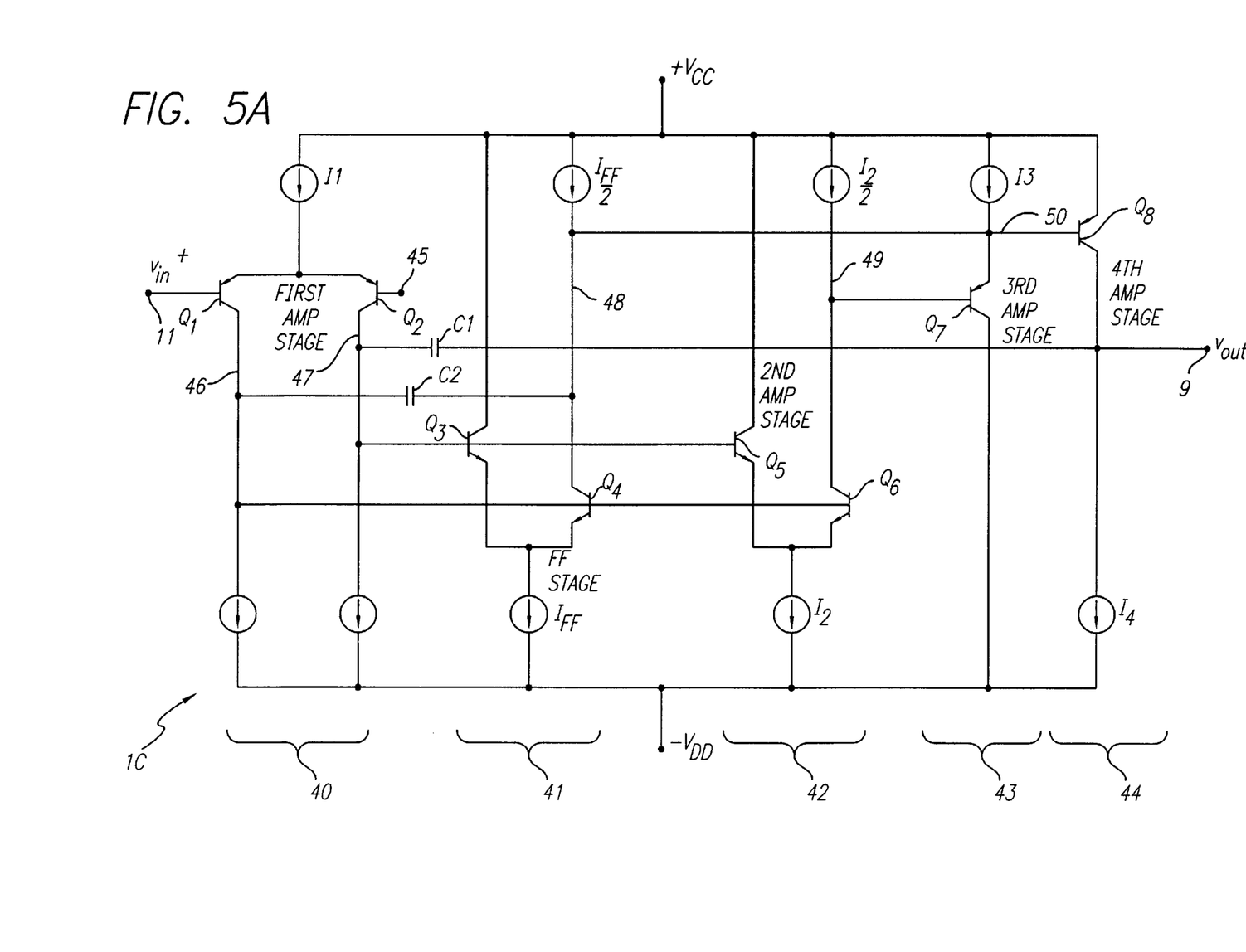
FIG. 5A is a simplified schematic diagram of another embodiment of the invention.
Figure 5B:
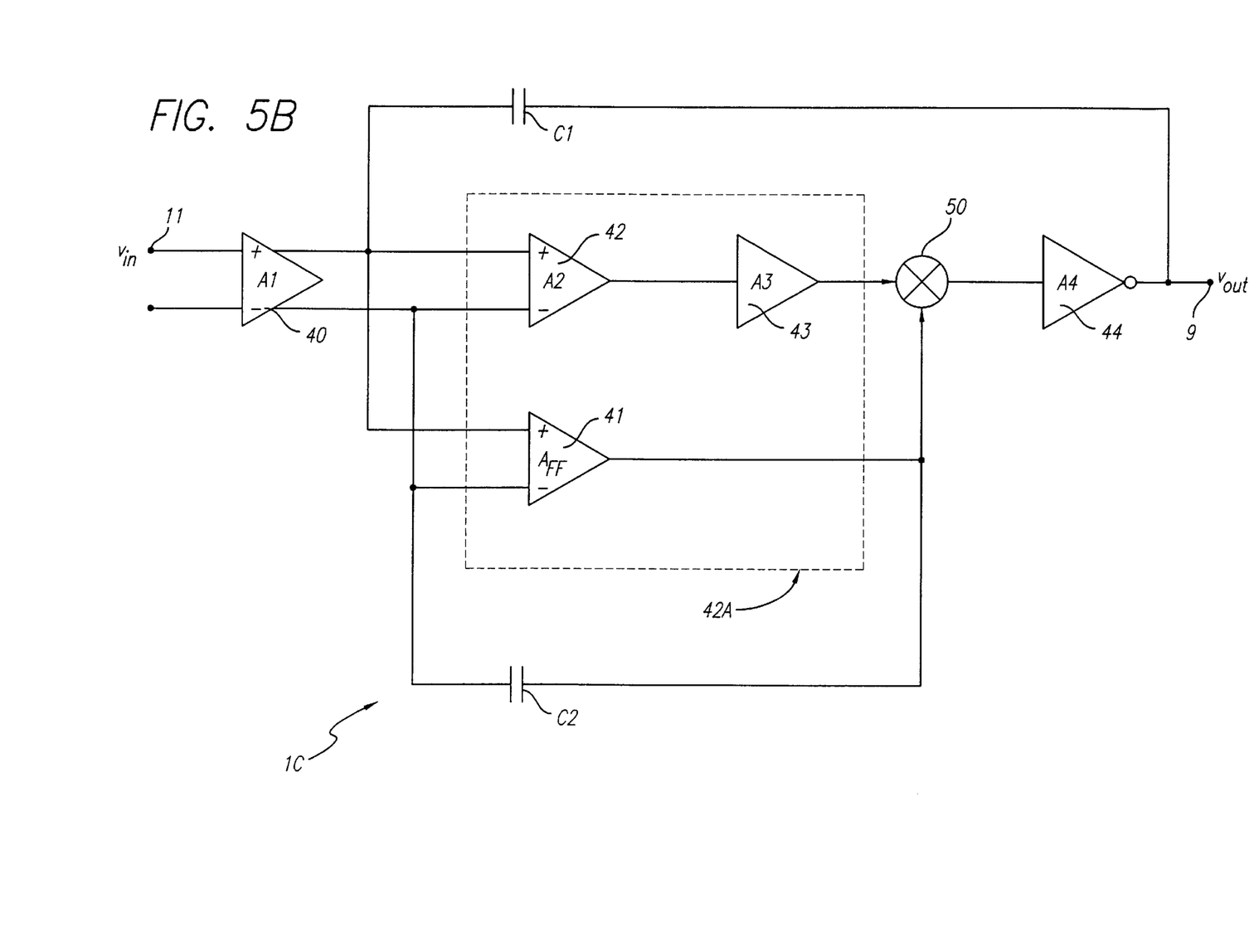
FIG. 5B is a block diagram of the circuitry shown in FIG. 5A.

Referring next to FIGS. 5A and 5B, a four-stage amplifier 1C includes a first stage 40 including PNP emitter-coupled transistors Q1 and Q2, with a gain of A1. The differential outputs of amplifier 40 are connected to the inputs of a second stage amplifier 42 including emitter-coupled NPN transistors Q5 and Q6, with a gain of A2. The non-inverting output 49 of second amplifier stage 42 is connected to the input of a non-inverting third stage amplifier 43 including PNP transistor Q7 and current source I3 and a gain of A3, producing an output at summing node 50. Summing node 50 is connected to the input of an inverting fourth amplifier stage 44 including PNP transistor Q8 and current source I4, with a gain of A4. The output of amplifier 44 is connected to output conductor 9. A compensation capacitor C1 is connected between output conductor 9 and the non-inverting input of second amplifier stage 42. The output conductor 50 of third stage amplifier 43 is connected by a compensation capacitor C2 to the inverting input of amplifier 42 and to the inverting input of a feed-forward amplifier 41 having its output connected to conductor 50 and its non-inverting input connected to the non-inverting input of amplifier 42.

Feed-forward stage 41 compensates the two-stage "equivalent amplifier" 42A which includes second stage amplifier 42 and third stage amplifier 43. That is, the gain of feed-forward amplifier 41 and the combined gain of amplifiers 42 and 43 are balanced so that amplifier 42A will not be unstable. Therefore, at high frequency, the circuitry of FIGS. 5A and 5B including amplifiers 41, 42, 43 and 44 can be thought of as a two-stage amplifier including amplifier 42A and amplifier 44 with the output connected to the inverting input, because capacitor C1 can be considered to be a short circuit at high frequency. That "equivalent" amplifier can be compensated by capacitor C2.

First, feed-forward stage 41 compensates the combined stages 42 and 43 without use of compensation capacitors. The bias currents are ratioed so that the bandwidth of feed-forward stage 41 is roughly ten times the bandwidth of combined stages 42 and 43. That provides, in effect, an equivalent single stage amplifier 42A (shown within dotted lines) connected in series with output stage 44. The bandwidth of that amplifier 42A is established by capacitor C1, which at high frequencies provides negative unity feedback to the input of equivalent amplifier 42A. In the prior art circuit of FIG. 2, a compensation capacitor is connected between the input and output of the output stage.

To one skilled in the art, that would be a logical place to provide a compensation capacitor, because the value of its capacitance and the value of the capacitor connected between the output of the output stage and the input of the middle stage are independent, and also because the compensation capacitor connected between the output and input of the output stage does not provide any loading on the input stage. Furthermore, the equations and analysis are simpler for the circuit of prior art FIG. 2 than for the circuit of FIG. 5B, and this also would suggest to one skilled in the art that a compensation capacitor should be connected across the output stage as in prior art FIG. 2.

Nevertheless, according to the present invention, the loop including stages 42A and 44 is compensated by connecting capacitor C2 between the input and output of stage 42A (FIG. 5B), even though capacitor C2 and capacitor C1 are interdependent and even though capacitor C2 loads the input stage 40. At high frequencies, capacitor C2 acts as a short circuit, effectively feeding the output of amplifier stage 40 forward to the input of amplifier stage 44 to convert the closed loop including stages 42, 43 and 44 and capacitor C1 to a stable one-stage equivalent amplifier which is quite different than the structure of prior art FIG. 1.

Thus, the above described embodiments of the invention accomplish use of fast forward feedback to provide frequency compensation of amplifier gain stages avoids the reduction of circuit speed and gain and the increase in physical size of integrated circuit amplifiers caused by use of frequency compensation capacitors.

Using the above described feed-forward frequency compensation technique, and also using the level shifter circuits disclosed in my commonly assigned co-pending patent application Ser. No. 08/816,990, filed Mar. 13, 1997 and entitled "VOLTAGE LEVEL SHIFTER AND METHOD", incorporated herein by reference, I was able to provide a bipolar micro-power instrumentation amplifier (the Assignee's part no. 1NA122) operable from a single power supply and having an input common-mode voltage range extending below the negative power supply rail and with rail-to-rail output voltage swings. That instrumentation amplifier has a two operational amplifier structure as shown in FIG. 2 of my above-identified co-pending application, with a 100 kilohertz bandwidth, a gain of 5, a common mode rejection ratio of 96 db, less than 150 microvolt input offset voltage, and draws only approximately 50 microamperes current from a power supply in the range from 2.2 volts to 36 volts.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. For example, while the above described preferred embodiment includes gain stages composed of bipolar transistors, it is equally applicable to gain stages composed of field effect transistors.

What is claimed is:

1. Amplifier circuitry that is frequency-compensated without the use of a compensation capacitor, the amplifier circuitry having an input receiving an input signal and an output producing an output signal, the amplifier circuitry comprising in combination:

(a) a first amplifier stage having a first input coupled to the input of the amplifier circuitry, a second input, and an output;
(b) a second amplifier stage having an input coupled to the output of the first amplifier and an output;
(c) a third amplifier stage having an input coupled to the output of the second amplifier stage and an output coupled to the output of the amplifier circuitry;
(d) a first feed-forward amplifier stage including a first input coupled to the input of the amplifier circuitry, and also including a second input, the first feed-forward amplifier stage including an output coupled to the output of the second amplifier stage;
(e) a second feed-forward amplifier stage having a first input coupled to the output of the first amplifier stage, a second input, and an output coupled to the output of the amplifier circuitry;
(f) a third feed-forward amplifier stage having a first input coupled to the input of the amplifier circuitry, a second input, and an output coupled to the output of the amplifier circuitry; and
(g) feedback circuitry coupled between the output of the amplifier circuitry and the second inputs of the first amplifier stage, the first feed-forward amplifier stage, and the third feed-forward amplifier stage.

2. The amplifier circuitry of claim 1 wherein the first input of the first amplifier stage is an inverting input.

3. The amplifier circuitry of claim 1 wherein the first input of the first feed-forward amplifier stage is a non-inverting input.

4. The amplifier circuitry of claim 1 wherein the gains of the first and second amplifier stages are such that the bandwidth of the combined first and second amplifier stages is at least approximately three times less than the bandwidth of the first feed-forward amplifier stage.

5. The amplifier circuitry of claim 4 wherein the gains of the second and third amplifier stages are such that the bandwidth of the combined second and third amplifier stages is at least approximately three times less than the bandwidth of the second feed-forward amplifier stage.

6. The amplifier circuitry of claim 5 wherein the gains of the first, second, and third amplifier stages are such that the bandwidth of the combined first, second, and third amplifier stages is at least approximately three times less than the bandwidth of the third feed-forward amplifier stage.

7. A method of compensating a three-stage amplifier including first, second, and third sequentially coupled stages without use of compensation capacitors, the method comprising the steps of:

(a) applying an input signal to an input of the first stage and a first input of a first feed-forward stage;
(b) coupling an output signal of the first feed-forward stage to an output of the second stage, the second stage having an input coupled to an output of the first stage;
(c) coupling an output signal of the first stage to an input of a second feed-forward stage;
(d) coupling an output of the second feed-forward stage to an output of the third stage;
(e) coupling the input signal to an input of a third feed-forward stage; and
(f) coupling an output of the third feed-forward stage to the output of the third stage.

8. The method of claim 7 wherein steps (a)–(f) are performed simultaneously.

9. The method of claim 7 including balancing the gains of the feed-forward stage and the gain of the combined second and third stages such that the bandwidth of the feed-forward stage is at least three times greater than the bandwidth of the combined second and third stages.

10. A method of compensating a three-stage amplifier including first, second, and third sequentially coupled stages without use of compensation capacitors, the method comprising the steps of:

(a) applying an input signal to an input of the first stage and a first input of a first feed-forward stage;

(b) coupling an output signal of the first feed-forward stage to an output of the second stage, the second stage having an input coupled to an output of the first stage;

(c) coupling an output signal of the first stage to an input of a second feed-forward stage;

(d) coupling an output of the second feed-forward stage to an output of the third stage;

(e) coupling the input signal to an input of a third feed-forward stage;

(f) coupling an output of the third feed-forward stage to the output of the third stage; and (g) providing the bias current of the feed-forward stage and the bias current of the combined second and third stages at such a ratio that the bandwidth of the feed-forward stage is at least three times greater than the bandwidth of the combined second and third stages.

11. The method of claim 10 wherein steps (a)–(g) are performed simultaneously.

12. The method of claim 11 wherein step (g) includes providing the bias currents at such a ratio that the bandwidth of the feed-forward stage is approximately ten times greater than the bandwidth of the combined second and third stages.

13. A method of compensating a four-stage amplifier including sequentially coupled first, second, third, and fourth stages, the method comprising the steps of:

(a) coupling a first capacitor between an output of the fourth stage and an input of the second stage to provide negative unity feedback at high frequencies and to establish the bandwidth of the four-stage amplifier, the input of the second stage being coupled to an output of the first stage, an output of the second stage being coupled to an input of the third stage, and an output of the third stage being coupled to an input of the fourth stage;

(b) applying an output signal of the first stage to an input of a feed-forward stage and the input of the second stage;

(c) applying an output signal of the feed-forward stage to the output of the third stage to compensate a first equivalent amplifier comprised of the second and third stages; and (d) coupling a second capacitor between the input of the second stage and the output of the third stage to compensate a second equivalent amplifier comprised of the first equivalent amplifier and the fourth stage.

14. The method of claim 13 wherein steps (a)–(d) are performed simultaneously.

15. A frequency compensated four-stage amplifier including sequentially coupled first, second, third, and fourth stages, comprising in combination:

(a) a first capacitor coupled between an output of the fourth stage and an input of the second stage to provide negative unity feedback at high frequencies and to establish the bandwidth of the four-stage amplifier, an input of the second stage being coupled to an output of the first stage, an output of the second stage being coupled to an input of the third stage, and an output of the third stage being coupled to an input of the fourth stage;

(b) a feed-forward stage having an input coupled to an output of the first stage and an output coupled to the input of the fourth stage to non-capacitively compensate a first equivalent amplifier comprised of the second and third stages; and (c) a second capacitor coupled between the input of the second stage and the output of the third stage to compensate a second equivalent amplifier comprised of the first equivalent amplifier and the fourth stage.

16. Amplifier circuitry that is frequency-compensated without the use of a compensation capacitor, the amplifier circuitry having an input receiving an input signal and an output producing an output signal, the amplifier circuitry comprising in combination:

(a) a first amplifier stage having a first input coupled to the input of the amplifier circuitry, a second input, and an output;

(b) a second amplifier stage having an input coupled to the output of the first amplifier and an output;

(c) a third amplifier stage having an input coupled to the output of the second amplifier stage and an output coupled to the output of the amplifier circuitry;

(d) a first feed-forward amplifier stage including a first input coupled to the input of the amplifier circuitry, and also including a second input, the first feed-forward amplifier stage including an output coupled to the output of the second amplifier stage;

(e) a second feed-forward amplifier stage having a first input coupled to the input of the amplifier circuitry, a second input, and an output coupled to the output of the amplifier circuitry; and (f) feedback circuitry coupled between the output of the amplifier circuitry and the second inputs of the first amplifier stage, the first feed-forward amplifier stage, and the second feed-forward amplifier stage.

17. Amplifier circuitry that is frequency-compensated without the use of a compensation capacitor, the amplifier circuitry having an input receiving an input signal and an output producing an output signal, the amplifier circuitry comprising in combination:

(a) a first amplifier stage having a first input coupled to the input of the amplifier circuitry, a second input, and an output;

(b) a second amplifier stage having an input coupled to the output of the first amplifier and an output;

(c) a third amplifier stage having an input coupled to the output of the second amplifier stage and an output coupled to the output of the amplifier circuitry;

(d) a first feed-forward stage having a first input coupled to the output of the first amplifier stage, a second input, and an output coupled to the output of the amplifier circuitry;

(e) a second feed-forward amplifier stage having a first input coupled to the input of the amplifier circuitry, a second input, and an output coupled to the output of the amplifier circuitry; and (f) feedback circuitry coupled between the output of the amplifier circuitry and the second inputs of the first amplifier stage and the second feed-forward amplifier stage.

* * * * *